United States Patent [19]
Goepel

[11] 4,188,653
[45] Feb. 12, 1980

[54] ELECTRICAL COMPONENT MOUNTING PACKAGE

[75] Inventor: Charles A. Goepel, Muncy, Pa.

[73] Assignee: GTE Sylvania Incorporated, Stamford, Conn.

[21] Appl. No.: 934,435

[22] Filed: Aug. 17, 1978

[51] Int. Cl.² ............................................. H05K 7/02
[52] U.S. Cl. .................................. 361/405; 361/417; 361/428; 336/192; 339/17 C
[58] Field of Search ............... 361/331, 332, 380, 392, 361/395, 397, 399, 400, 404, 405, 417, 419, 426, 428; 336/192; 339/17 C, 18 R

[56] References Cited

U.S. PATENT DOCUMENTS

| | | | |
|---|---|---|---|
| 2,899,631 | 8/1959 | Cushman | 336/192 |
| 3,076,165 | 1/1963 | Weyrich | 336/192 |
| 3,644,792 | 2/1972 | Fields | 339/17 C |
| 3,659,340 | 5/1972 | Giedd | 361/419 |
| 3,790,858 | 2/1974 | Brancaleone | 361/399 |
| 4,082,394 | 4/1978 | Gedney | 361/405 |

FOREIGN PATENT DOCUMENTS 1226209 10/1966 Fed. Rep. of Germany ........... 361/405

*Primary Examiner*—Gerald P. Tolin
*Attorney, Agent, or Firm*—Thomas H. Buffton

[57] ABSTRACT

A mounting package for electrical components includes a printed circuit board with a conductive pattern and solder on one side for attaching wires extending through spaced holes, an electrical component with connecting wires, electrical wires, and an insulator frame with apertures and connector pins aligned with the spaced holes of the circuit board wherein the connecting and electrical wires selectively extend through the apertures and are affixed to the connector pins with the wires and connector pins passing through the holes and soldered to the printed circuit board.

5 Claims, 1 Drawing Figure

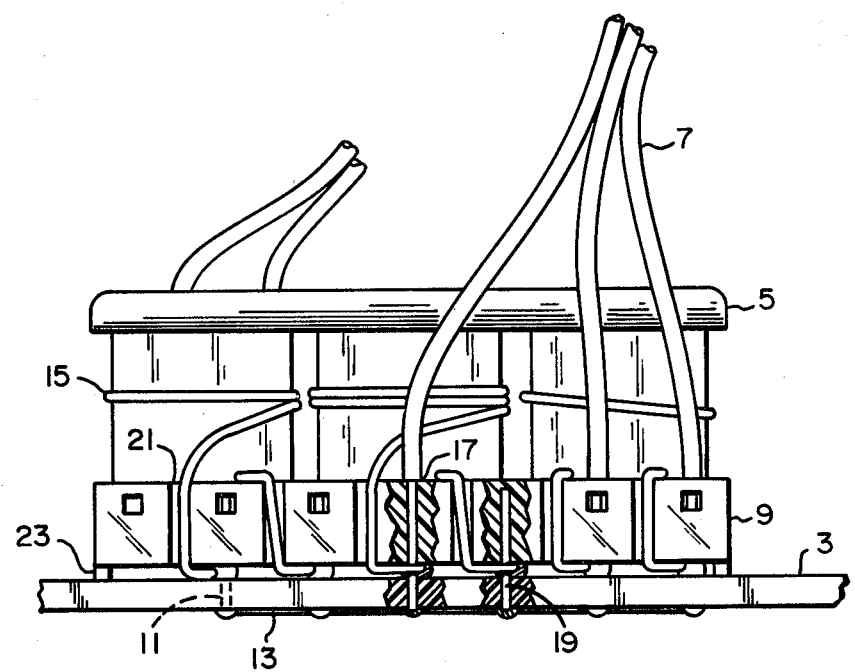

4,188,653

ELECTRICAL COMPONENT MOUNTING PACKAGE

TECHNICAL FIELD

This invention relates to electrical components and more particularly to an electrical component and printed circuit board package.

BACKGROUND ART

In the art of packaging electrical components and a printed circuit board, it has been a common practice to provide a plastic frame having a plurality of connector pins embedded therein and extending outwardly therefrom. Each of the connector pins is aligned with a hole in the printed circuit board and formed for passage therethrough. Moreover, the printed circuit board is applied to a "wave-soldering" apparatus whereby the connector pins are affixed to the circuit board.

Normally, an electrical component, such as a transformer for example, is attached to the plstic frame with the electrical wires therefrom electrically connected to the individual connector pins of the plastic frame. In turn, the connector pins are soldered to the printed circuit board. Also, separate electrical wires are passed through other holes in the printed circuit board and also soldered thereto. A conductive pattern on the printed circuit board provides electrical connection between the connector pins affixed to the electrical component and the separate electrical wires affixed to the printed circuit board.

In other words, wires from an electrical component are attached to connector pins which are soldered to a printed circuit board, separate electrical wires are soldered to the circuit board, and a conductive network on the printed circuit board electrically connects the electrical wires and the wires of the component. Obviously, such a technique required a rather complex and extensive conductive network on the printed circuit board, extra space for the separate electrical wires affixed to the circuit board, and added cost in labor and materials for effecting the attachment and connection therebetween.

DISCLOSURE OF THE INVENTION

In one aspect of the invention, an electrical component mounting package includes a printed circuit board with a plurality of spaced holes selectively connected by a conductive network and solder on one side for affixing wires extending through the circuit board holes, an electrical component with connecting wires, separate electrical wires, and an insulator frame with spaced apertures and embedded connector pins aligned with the holes of the printed circuit board. The component connecting wires and the separate electrical wires are selectively passed through the apertures of the frame and/or affixed to the embedded connector pins of the insulator frame and then enter the holes and are soldered to the printed circuit board.

BRIEF DESCRIPTION OF THE DRAWING

The sole FIGURE is an elevational view, partly in section, of a preferred embodiment of the invention.

PREFERRED EMBODIMENT OF THE INVENTION

For a better understanding of the present invention, together with other and further objects, advantages and capabilities thereof, reference is made to the following disclosure and appended claims in connection with the accompanying drawing.

Referring to the drawings, an electrical component mounting package includes a printed circuit board 3, an electrical component in the form of a transformer 5, a plurality of separate electrical wires 7, and a frame member 9 of electrical insulating material. Moreover, the frame member 9, separate electrical wires 7, and transformer 5 are all connected to the printed circuit board 3.

More specifically, the printed circuit board 3 includes a plurality of spaced holes 11 formed for passage of electrical wires and conductors therethrough to a conductive network 13 on one side thereof. Thereat, the wires and conductors are soldered and electrically connected. Also, the electrical component 5 includes a plurality of connecting wires 15.

Additionally, the frame member 9 is of an electrical insulating material, such as plastic for example, and includes a plurality of apertures 17 extending therethrough. A plurality of connector pins 19 are embedded in the frame member 9. Also, the spaced apertures 17 and embedded connector pins 19 are separated by slots 21. Moreover, a stand-off insulator portion 23 spaces the frame member 9 from the printed circuit board 3.

In operation, the connecting wires 15 of the electrical component 5 are fed through the slots 21 of the frame member 9 and soldered or otherwise attached to a connector pin 19. In turn, the connector pin 19 is passed through a hole 11 in the printed circuit board 3 and soldered thereto. Also, the separate electrical wires 7 are passed through an aperture 17 in the frame member 9, through a hole 11 in the printed circuit board 3 and soldered thereto.

Alternatively, the connecting wires 15 of the electrical component 5 may be fed through the apertures 17 of the frame member 9 and through a hole 11 of the printed circuit board 3 to be soldered thereto. Also, the separate electrical wires 7 may be fed through the slot 21 of the frame member 9 and affixed to a connector pin 19. Moreover, the connecting wire 15 of an electrical component 5 may be fed through a slot 21 of the frame member 9 and connected to an electrical wire 7 fed through an aperture 17 of the frame member 9. Thus, a conductive network 13 is either not required or at least the complexity thereof greatly reduced due to the capability for electrical connection of the component connecting wires 15 and electrical wires 7 prior to utilization of the printed circuit board conductive network.

While there has been shown and described what is at present considered a preferred embodiment of the invention, it will be obvious to those skilled in the art that various changes and modifications may be made therein without departing from the invention as defined by the appended claims.

INDUSTRIAL APPLICABILITY

Thus, there has been provided a unique electrical component mounting package utilizing a printed circuit board, electrical components, separate electrical wires and a unique frame member having both apertures and embedded connector pins. The package reduces both labor and assembly costs and space requirements while enhancing reliability and convenience. Moreover, the electrical component package is especially suitable to electrical apparatus, such as ballasts circuits for lighting for example, wherein economy of weight and space are essential.

I claim:

1. In a mounting package including electrical wires and an electrical component with connecting wires and also including a printed circuit board having a plurality of spaced holes and an electrically conductive pattern and solder on one side of said board and an insulating frame member on the other side of said board with slots and selectively positioned apertures and connector pins aligned with said spaced holes of said printed circuit board, the improvement wherein said electrical wires pass through and extend from said apertures of said insulating frame member, said connecting wires of said electrical component pass through said slots and are affixed to said connector pins, and said electrical wires extending from said apertures and said connector pins pass through said spaced holes and are affixed to said electrically conductive pattern of said printed circuit board by said solder.

2. The improvement of claim 1 wherein said insulating frame includes stand-off members extending in the same direction as said connector pins to space said frame from said printed circuit board.

3. The improvement of claim 1 wherein said component is in the form of a transformer affixed to and supported by said insulating frame member.

4. The improvement of claim 1 wherein said component is in the form of a transformer having wires extending therefrom and wound about said connector pins and said associated electrical wires extend through said apertures of said frame member.

5. The improvement of claim 1 wherein said frame member is a plastic member with said connector pins embedded therein and said apertures passing therethrough.

* * * * *